(12) United States Patent
Zheng et al.

(10) Patent No.: US 10,296,685 B2
(45) Date of Patent: May 21, 2019

(54) FAILURE LOGIC MODELING METHOD FOR A HIGH-SPEED RAILWAY TRAIN OPERATION CONTROL ON-BOARD SYSTEM

(71) Applicant: BEIJING JIAOTONG UNIVERSITY, Beijing (CN)

(72) Inventors: Wei Zheng, Beijing (CN); Lingyun Yang, Beijing (CN); Weijie Kong, Beijing (CN); Dewang Ren, Beijing (CN); Lixiang Wang, Beijing (CN)

(73) Assignee: BEIJING JIAOTONG UNIVERSITY, Beijing (CN)

( * ) Notice: Subject to any disclaimer, the term of this patent is extended or adjusted under 35 U.S.C. 154(b) by 214 days.

(21) Appl. No.: 14/909,853

(22) PCT Filed: Apr. 24, 2014

(86) PCT No.: PCT/CN2014/076144
§ 371 (c)(1),
(2) Date: Feb. 3, 2016

(87) PCT Pub. No.: WO2015/143750
PCT Pub. Date: Oct. 1, 2015

(65) Prior Publication Data
US 2017/0124234 A1    May 4, 2017

(30) Foreign Application Priority Data
Mar. 27, 2014  (CN) .......................... 2014 1 0121103

(51) Int. Cl.
*G06F 17/50* (2006.01)
*B61L 27/00* (2006.01)

(52) U.S. Cl.
CPC ...... *G06F 17/5022* (2013.01); *B61L 27/0038* (2013.01); *B61L 27/0055* (2013.01); *G06F 17/5095* (2013.01); *G06F 17/5009* (2013.01)

(58) Field of Classification Search
USPC ......... 703/2, 6; 700/90; 701/29.1, 29.4, 29.6
See application file for complete search history.

(56) References Cited

U.S. PATENT DOCUMENTS

| 5,082,208 A | * | 1/1992 | Matich | .................... B64C 13/40 |
|---|---|---|---|---|
| | | | | 244/194 |
| 6,850,869 B2 | * | 2/2005 | Pierro | ................. B61L 27/0083 |
| | | | | 701/29.4 |

(Continued)

FOREIGN PATENT DOCUMENTS

CN    102514598    6/2012

OTHER PUBLICATIONS

Dong, X., Fault and Reliability Analysis for Locomotive and Car, Railway Locomotive & Car, Dec. 2004, pp. 43-46, vol. 24, No. 6.

*Primary Examiner* — Thai Q Phan
(74) *Attorney, Agent, or Firm* — IP & T Group LLP

(57) ABSTRACT

The present invention provides a failure logic modeling method for a high-speed railway train operation control on-board system, including the following steps: determining the functional relationship between the structure and the parts of the train control on-board system; analyzing the failures of the parts based on known failures of the train control on-board system in combination with brainstorming; establishing an FMEA table to generalize the failures of the parts; editing and simulating the failures by using a modeling tool. By adopting the present invention, the failure modes analyzed are more systematic, and the failure logic modeling can be carried out from a global perspective more easily, the whole process can be better targeted meanwhile, the security analysis complexity of the train control system (Continued)

will be effectively reduced and the development period of the train control system will be shortened.

9 Claims, 2 Drawing Sheets

(56) References Cited

U.S. PATENT DOCUMENTS

| | | | | |
|---|---|---|---|---|
| 7,705,743 | B2* | 4/2010 | Barone | B61L 15/0027 340/682 |
| 8,560,151 | B2* | 10/2013 | Armitage | H04Q 9/00 701/20 |
| 8,781,671 | B2* | 7/2014 | Beck | B60T 13/665 340/453 |
| 9,469,319 | B2* | 10/2016 | Beck | B60T 13/665 |
| 2004/0073324 | A1* | 4/2004 | Pierro | B61L 27/0083 700/90 |
| 2006/0290199 | A1* | 12/2006 | Beck | B60T 13/665 303/7 |
| 2007/0208841 | A1* | 9/2007 | Barone | B61L 15/0027 709/223 |
| 2011/0040444 | A1* | 2/2011 | Regnard De Lagny | B60W 50/0205 701/29.2 |
| 2014/0257605 | A1* | 9/2014 | Beck | B60T 13/665 701/19 |
| 2015/0066286 | A1* | 5/2015 | Connolly | G06Q 10/00 701/29.6 |

* cited by examiner

FAILURE LOGIC MODELING METHOD FOR A HIGH-SPEED RAILWAY TRAIN OPERATION CONTROL ON-BOARD SYSTEM

This application is a national stage application of PCT/CN2014/076144 filed on Apr. 24, 2014, which claims priority of Chinese patent application number 201410121103.3 filed on Mar. 27, 2014. The disclosure of each of the foregoing applications is incorporated herein by reference in its entirety.

FIELD OF THE INVENTION

The present invention relates to a failure logic modeling method for a high-speed railway train operation control on-board system, which belongs to the field of failure diagnosis technology of train control system.

BACKGROUND OF THE INVENTION

A train operation control system is an important part of modernization of a Chinese railway technology system and equipment and is one of the core technologies for guaranteeing safe, reliable and efficient operation of high-speed trains. Once the system fails, the result is often disastrous. With the rapid development of the national economy, the acceleration of urbanization, the expansion of railway construction scale and the further improvement of train speeds, a high-speed railway operation control system has played an increasingly important role, which also means that higher requirements are proposed for the safe and efficient operation of the train control system.

An on-board system is an important part of a CTCS-3 (Chinese Train Control System, the third generation, referred to as C3) level train operation control system, and is responsible for receiving ground data command information, generating a speed mode curve, monitoring the operation of a train and guaranteeing the safe operation of the train. Whether the system structure of the on-board system is reasonable is directly related to the safe operation of the train, thus security analysis needs to be carried out on the system structure. Weak links of system reliability may be found by the security analysis, and the design of the system can be further perfected accordingly, to further improve the performance of the system.

So far, a plurality of technologies have been developed based on the security analysis method, however, there are still some shortcomings when the security analysis method is applied to the train control system. FMEA (Failure Mode and Effects Analysis, potential failure mode and effects analysis) has very heavy workload, requires a user to have a sufficient understanding of the system, and cannot be used for analyzing the influence of a combined failure mode on the system. A failure tree analysis method proposes higher requirements on the user and has poorer reusability. HAZOP (Hazard and Operability Analysis, hazard and operability) has a prolix analysis process, and highly depends on experts and experience, while the accuracy of analysis results is limited.

Most of the methods above are highly subjective and depend on the ability of participants, the analysis is usually based on an informal system model and is very difficult to be complete, continuous and error-free, thereby influencing the reliability analysis of the train control system to a certain extent and potentially threatening life and property of people. Accordingly, a method capable of describing the inherent characteristics of the train control system and carrying out security analysis on the train control system is needed urgently.

SUMMARY OF THE INVENTION (1) Technical Problem to be Solved

The technical problem to be solved by the present invention is to comprehensively and efficiently carry out security analysis modeling on a train control on-board system.

(2) Technical Solution

To solve the technical problem above, the present invention provides a failure logic modeling method for a high-speed railway train operation control on-board system, including the following steps:

Determining the functional relationship of the structure and the parts of the train control on-board system;

Analyzing the failures of the parts based on known failures of the train control on-board system in combination with brainstorming;

Establishing an FMEA table to generalize the failures of the parts;

Editing and simulating the failures by using a modeling tool.

Preferably, the step of determining the functional relationship of the structure and the parts of the train control on-board system further includes:

Determining the structure of the train control on-board system and clarifying the functional relationship of modules and components according to a general technical solution of the high-speed railway train control system, a structure diagram of the train control on-board system and a UML model of the system.

Preferably, in the step of determining the functional relationship of the structure and the parts of the train control on-board system, the modules and the devices are named in English and beginning with a capital letter.

Preferably, the step of analyzing the failures of the parts based on known failures of the train control on-board system in combination with brainstorming further includes:

At the conceptual stage, matching corresponding guide words with parameters in an information flow, then a sequence of failures are generated, and analyzing the reason and result of each failure;

On the other hand, at the onsite stage, selecting unlisted failures in the brainstorming from a risk database or historical risk accumulation for supplementing and expanding, and repeating the flow at the conceptual stage.

Preferably, the step of establishing an FMEA table to generalize the failures of the parts further includes:

Carrying out sub-module division on the train control on-board system according to actual demands;

Listing the failure modes of the modules and the components of the train control on-board system through the FMEA table;

Progressively arranging the failure components from bottom to top for analysis and summarization;

Analyzing every input failure, self-failure, output failure and double failure of each component, and sequentially transmitting the failures from head to tail until the failures arrive at a top end ATPCU.

Preferably, the FMEA table includes a failure component, an input component, an input failure mode, a self-failure mode, an output failure mode, a double failure mode and an output component.

Preferably, the step of editing the failures by using a modeling tool further includes:

Abstracting the summarized failure modes and the structural relationships of the modules and the components into failure logic models, and generating system level and component level failure logic models according to system design in combination with a simulation technology.

Preferably, the failure logic models are a balise, a miniature antenna unit CAU, a balise transmission module BTM, a radio communication station GSM-R, a general confidentiality device GCD, an on-board security transmission unit STU, a secure digital input output VDX, a radar, a speed sensor, a speed and distance measurement unit SDU, a speed and distance processing unit SDP, a man-machine interface DMI and an on-board security computer unit ATPCU, respectively.

Preferably, in the step of editing and simulating the failures by using a modeling tool, a Stateflow modeling tool is selected.

Preferably, the step of simulating the failures by using a modeling tool further includes:

Describing a transmission process of the input failure and the self-failure in the failure component by using a Stateflow component model, outputting the output failure to simulink through stateflow, and obtaining a transmission result of the failures in a display device of the simulink;

Establishing an overall architecture of the failure logic model and a failure transmission relationship of the modules in a Matlab/simulink component;

Editing the self-failure and the input failure of a bottom layer module in a simulink component, and indicating whether the failure happens via a Boolean value generated in a switch form;

Establishing an event-driven model in a stateflow component, wherein the driving conditions are the input failure and the self-failure in the external simulink component;

Transferring a bottom failure layer into the ATPCU, and setting the display device at the output end of the ATPCU to obtain a final simulation result.

(3) Beneficial Effects

According to the failure logic modeling method for the high-speed railway train operation control on-board system provided by the present invention, by integrating the FMEA analysis method and the stateflow modeling tool, the analyzed failures are more systematic, the complicated logic problem is solved, what's more, complete, continuous and error-free security analysis of the train control system is achieved.

SPECIFIC EMBODIMENTS

A further detailed description of the specific embodiments of the present invention will be given below in conjunction with accompanying drawings and embodiments. The following embodiments are intended to illustrate the present invention, rather than restricting the scope of the present invention.

Figure 1:
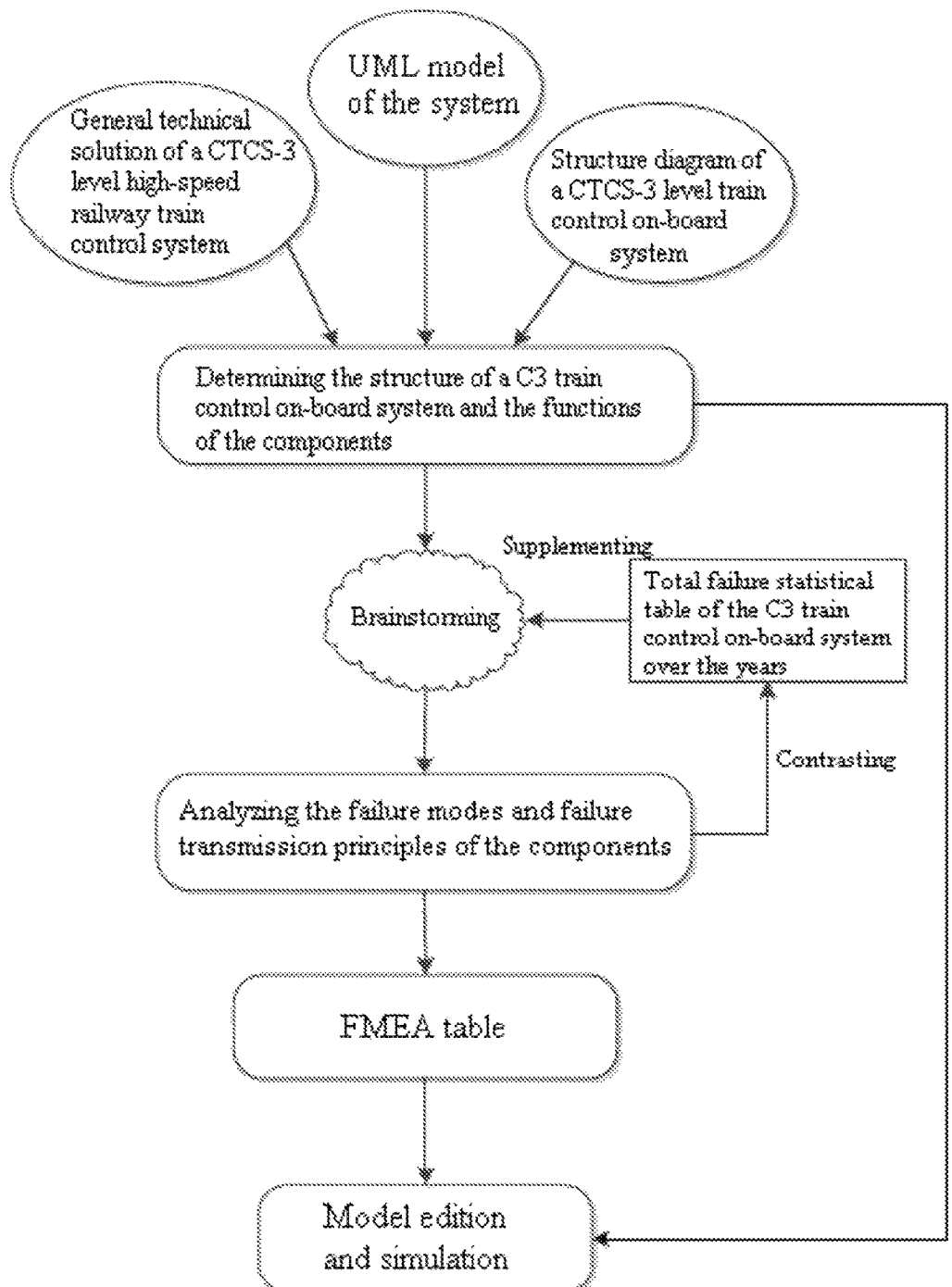
FIG. 1 is a schematic diagram of a failure logic modeling flow of a high-speed railway train operation control on-board system provided by the present invention.

The present invention provides a failure logic modeling method for a high-speed railway train operation control on-board system, as shown in FIG. 1, specifically including the following steps: determining the functional relationship between the structure and the parts of the train control on-board system; analyzing the failures of the parts based on known failures of the train control on-board system in combination with brainstorming; establishing an FMEA table to conclude the failures of the parts; editing and simulating the failures by using a modeling tool. A detailed illustration of the present invention is given below.

First, the step of determining the functional relationship between the structure and the parts of the train control on-board system is described.

The high-speed railway train operation control on-board system is very complicated and consists of a plurality of subsystems, what's more, each subsystem is composed of more than hundreds of modules, Each subsystem is organically connected via a multi-dimensional and multi-layered interface to form an integral train control on-board system. For example, in the train control on-board system, CTCS-3 is composed of a plurality of modules as many as more than one hundred in total, each subsystem is organically connected via a multi-dimensional and multi-layered interface to form an integral CTCS-3 train control on-board system, instead of simply stacking together to achieve the functions of the train control on-board system. A core ATPCU is determined in the integral CTCS-3 train control on-board system, including on-board subsystems such as a GSM-R radio communication unit (RTM), a balise information receiving module (BTM), a man-machine interface (DMI), etc.

According to the general technical solution of the high-speed railway train control system, the structure diagram of the train control on-board system and the UML model of the system, the structure of the train control on-board system is determined and the functional relationship between the modules and components is clarified, to make sure do the preparatory work of original data for subsequent failure mode analysis; since there are huge amount of modules and devices of the entire train control on-board system, the modules and the devices are respectively named in English with the first letter capitalized, which avoids subsequent modeling software error resulting from irregular name and improves the working efficiency.

Then, the step of analyzing the failures of the parts based on known failures of the train control on-board system in combination with brainstorming is described.

A component set is selected according to the structure, functions and characteristics of the train control on-board system, and brainstorming is carried out on this basis to analyze possible failures. According to the structure and the functional relationship, the train control on-board system is divided into 5 functional units: a communication unit, a balise unit, a speed and distance measurement unit, a brake unit and a rail circuit unit, wherein each unit is respectively composed of different components. Failure analysis is carried out on each component by reviewing literature materials and performing brainstorming. At the conceptual stage, the components need to transmit information to complete the functions of the train control on-board system. Therefore, an information flow exists between the components. Corresponding guide words (No, More, Less, Wrong, Early, Late, Before, After) are matched with parameters in the information flow into each failure, then the reason and result of each failure are analyzed. In addition, at an onsite stage, unlisted failures in the brainstorming are selected from a risk database or historical risk accumulation for supplementing and expanding, and the flow at the concept stage is repeated.

Since the train control on-board system is composed of a plurality of subsystems and modules, the failure modes of the plurality of subsystems and modules are complicated with fuzzy uncertainty, a great deal of literature review is required to find out all possible failure modes (the failure modes refer to failure phenomena of components or products, which can be observed). After the first round of brainstorming, parts of failures are certainly not considered due to insufficient artificial experience. To overcome this shortcoming, the real onsite data in the risk database can be used to inspire the brainstorming. According to clues in the real data, another brainstorming may be continued to supplement and expand the failure modes. In combination with the real onsite data of a total failure statistical table of the C3 train control on-board system, failure modes left out of consideration resulting from manual analysis insufficient artificial experience are complemented, such that the analysis result is more reasonable, scientific and accurate.

Again, the step of establishing an FMEA table to conclude the failures of the parts is described.

According to the characteristics of the FMEA analysis method, the train control on-board system is divided into systems, equipment and elements, the C3 train control on-board system is divided into sub-modules according to actual demands, so that respective possible failure types and the influence generated are analyzed to take corresponding countermeasures. The failure modes of the modules and the components of the train control on-board system are listed through the FMEA table. The information contained in the table includes: failure components, input components, input failure modes, self-failure modes, output failure modes, double failure modes and output components; the failure components are progressively arranged from bottom to top for analysis and summarization; an input failure, a self-failure, an output failure and a double failure of each component are analyzed, and the failures are sequentially transmitted from head to tail until the failures arrive at a top end ATPCU, through which risk of the train control on-board system can be identified in terms of the failure modes and the influence of the failure modes on the train control on-board system can be evaluated on this basis. A detailed illustration of the step is given below taking the C3 train control on-board system for instance.

As shown in Table 1, the failure modes and the double failures of the components of the C3 train control on-board system are listed by the FMEA table, which are specifically as follows:

The failure component: the failure component is the bottom layer components of the functional modules of the C3 train control on-board system, for example, a miniature antenna unit (CAU), a balise transmission module (BTM), a speed and distance unit (SDU), a speed and distance processing unit (SDP), etc.

The input component: for a certain failure component, the input component therefore is a component used for providing data to the failure component. For example, the input component of BTM is CAU, and the input component of SDP is SDU.

The input failure mode: the consequence or influence of the failure mode of the input component on a certain component. The output failure mode of a lower component is the input failure mode of an upper layer component.

The self-failure mode: a software or hardware failure of the component itself.

The output failure mode: the consequence generated by the input failure mode and the self-failure mode of the component on the output component.

The double failure mode: two failure modes happen at the same time, which can be combinations of different types and different modules.

The output component: the output component of a certain failure component is the object receiving output data of the failure component. For example, the output component of CAU is BTM, and the output component of SDU is SDP.

TABLE 1

FMEA table of C3 train control on-board system

| Failure component | Input component | Input failure mode | Self-failure mode | Output failure mode | Output component |
|---|---|---|---|---|---|
| Balise | None | Balise transiently inputs disturbance | | Balise outputs no message<br>Balise outputs all zero message<br>Balise outputs error message | CAU |
| | | | Failure of internal balise | Balise outputs no message | |
| | | | Poor stern line contact of balise | Balise outputs all zero message | |
| CAU | Balise | Balise outputs no message<br>Balise outputs all zero message<br>Balise outputs error message | | CAU outputs no message | BTM |
| | | | | CAU outputs error message | |
| | | | CAU inflow | CAU tails to connect BTM | |
| BTM | CAU | CAU inputs no message | | BTM outputs no message | C3 CU |
| | | CAU outputs error message | | BTM outputs error message | |
| | | CAU fails to connect BTM | | BTM outputs no message | |
| | | | Permanent BSA error<br>BTM port failure<br>BTM dead halt | BTM outputs no message | |

TABLE 1-continued

FMEA table of C3 train control on-board system

| Failure component | Input component | Input failure mode | Self-failure mode | Output failure mode | Output component |
|---|---|---|---|---|---|
| C3 CU | BTM | BTMoutputs no message BTM outputs all zero message BTM outputs error message | BTM suffers transient external disturbance<br><br>D cable orMVBbus is distributed<br><br><br>a/b code non-uniformity: MA, v-mrsp, level switch, RBC transfer, GPP A/b core code wrong or invalid C3CU receiving interference signal GPP (communication protocol packet) link loss Profibus data packet abnormality C3CU module failure | BTM outputs no message BTM outputs all zero message BTM outputs error message BTM outputs an all zero messaee C3CU invalid | |

In the present invention, the risk of the train control on-board system is identified via the failure modes of the system, the subsystems, the modules and the components in the FMEA table, and the influence of the failure modes on the train control on-board system is evaluated on this basis. The input failures, the self-failures, the output failures and the double failures of each component are analyzed, and the failures are sequentially transmitted from head to tail until the failures arrive at the top end ATPCU. Potential failures and corresponding consequence of a product are found by the FMEA analysis method, and measures capable of avoiding or reducing the failure are found and continuously perfected.

Finally, the step of editing and simulating the failures by using a modeling tool is described.

A failure logic model forming a mutual mapping relationship with the failure mode table is established based on the failure mode table (FMEA) and the structure and the functional relationship of the C3 train control on-board system. In the step, the summarized failure modes and the structural relationships between the modules and the components are abstracted into failure logic models, ultimately system level and component level failure logic models are generated in combination with a simulation technology according to the train control on-board system design.

The failure logic models are divided into five subsystems which consist of 13 modules in total, including respectively a balise, a miniature antenna unit CAU, a balise transmission module BTM, a radio communication station GSM-R, a general confidentiality device GCD, an on-board security transmission unit STU, a secure digital input output VDX, a radar, a speed sensor, a speed and distance measurement unit SDU, a speed and distance processing unit SDP, a man-machine interface DMI and an on-board security computer unit ATPCU.

Figure 2:
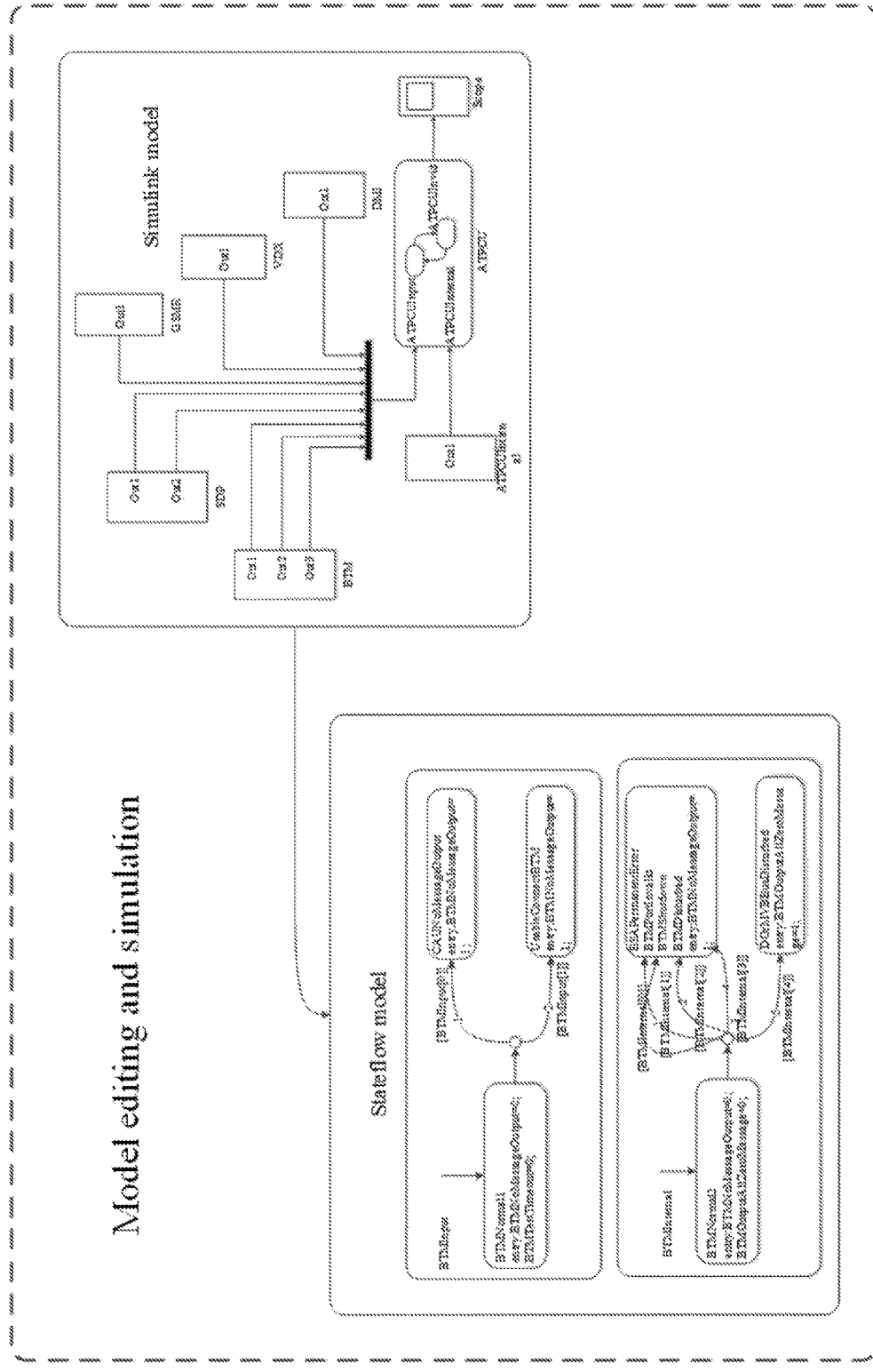
FIG. 2 is a schematic diagram of a failure editing and simulating flow by adopting a modeling tool in the present invention.

In the present invention, a Stateflow modeling tool is preferably adopted to achieve the editing and simulating functions of the above-mentioned failure transmission model and the establishment of failure logic model. As shown in FIG. 2, in which a simulink component is in one-to-one correspondence with the structure of the train control on-board system, a transmission process of the input failure and the self-failure internally in the failure component is described by using a stateflow model, the output failure is output to the simulink component through the stateflow model, and a transmission result of the failures can be obtained in a display device of the simulink component. An overall architecture of the failure logic model and a failure transmission relationship of the modules are established in a Matlab/simulink component. In order to achieve complicated control and effective supervision, the self-failure and the input failure of a bottom layer module are edited in the simulink component, and whether the failure happens is indicated via a Boolean value generated in a switch form, "1" indicates that a failure happens, and "0" indicates that failures don't happen. An event-driven model is established in the stateflow model, wherein the driving conditions are the input failure and the self-failure in the external simulink component. If a driving condition C between the state A and the state B is activated, then the state changes from which is at the starting point of the arrow to the state of the end point, and the transfer route, namely the failure transmission route becomes blue and is clear to identify. A bottom failure layer is transferred into the ATPCU, and the display device is arranged at the output end of the ATPCU to obtain a final simulation result.

In summary, in the present invention, the FMEA method is technically integrated into failure logic modeling. The FMEA method is used for analyzing the failure modes and the influence of the key components to determine the input and output influence of the connected components, so that the analyzed failure modes are more systematic, and the failure logic modeling can be carried out from a global perspective more easily with a definite purpose. The stateflow is applied to the failure logic modeling to convert the failure modes and solve the problem of complicated monitoring logic. The combination of stateflow and the simulink ensures better event-driven control capability for the simulink.

The above-mentioned embodiments are only used to illustrate the present invention, which can't restrict the scope of the present invention. The common technicians in related technical fields can make sorts of change and modification without breaking away from the original purposes and scope of the present invention, therefore, all the identical technical solutions should be treated as parts of the present invention. The patent protection scope of the present invention should be limited in accordance with claims.

INDUSTRIAL APPLICABILITY

In the present invention, the FMEA method is merged into failure logic modeling to technically integrate the two, the FMEA method is used for analyzing the failure modes and the influence of the key component to determine the input and output influence of the connected components, so that the analyzed failure modes are more systematic, and the failure logic modeling can be carried out from a global perspective more easily with a definite purpose. The stateflow is applied to the failure logic modeling to convert the failure modes and to solve the problem of complicated monitoring logic. The combination of stateflow and the simulink ensures better event-driven control capability for the simulink.

The invention claimed is:

1. A failure logic modeling method for a high-speed railway train operation control on-board system comprising modules and components, the method comprising steps of:
   determining the functional relationship between the modules and components of the train control on-board system;
   analyzing the modules and components to identify failures and failure modes based in part on results of the determining step and on known failures of the train control on-board system accessed from a database;
   generating an FMEA table to associate, for each module and component for which a failure was identified, at least one of the failure modes; and
   modeling and simulating the failures using a modeling tool.

2. The method of claim 1, wherein the step of determining the functional relationship between the modules and components of the train control on-board system further comprises a step of:
   determining the structure of the train control on-board system to clarify the functional relationship between the modules and the components according to a general technical solution of the high-speed railway train control system, a structure diagram of the train control on-board system and a UML model of the system.

3. The method of claim 1, wherein the step of analyzing the modules and components to identify failures and failure modes based in part on results of the determining step and on known failures of the train control on-board system accessed from a database further comprises a step of:
   matching corresponding guide words with parameters in an information flow, generating a sequence of failures, and analyzing the reason and result of each failure;
   wherein the database comprises a risk database.

4. The method of claim 1, wherein the step of generating an FMEA table to associate, for each module and component for which a failure was identified, at least one failure mode further comprises steps of:
   carrying out sub-module division on the train control on-board system according to actual demands;
   listing the failure modes of the modules and the components of the train control on-board system through the FMEA table;
   arranging the failure components from bottom to top for analysis and summarization;
   analyzing every input failure, self-failure, output failure and double failure of each component, and sequentially transmitting the failures until the failures arrive at a top end ATPCU.

5. The method of claim 4, wherein the FMEA table comprises a failure component, an input component, an input failure mode, a self-failure mode, an output failure mode, a double failure mode and an output component.

6. The method of claim 1, wherein the step of modeling the failures using a modeling tool further comprises a step of:
   modeling, using failure logic models, summarized failure modes and the structural relationships between the modules and the components, and generating system level and component level failure logic models in combination with a simulation technology and according to train control on-board system design.

7. The method of claim 6, wherein the failure logic models comprise a balise, a miniature antenna unit CAU, a balise transmission module BTM, a radio communication station GSM-R, a general confidentiality device GCD, an on-board security transmission unit STU, a secure digital input output VDX, a radar, a speed sensor, a speed and distance measurement unit SDU, a speed and distance processing unit SDP, a man-machine interface DMI and an on-board security computer unit ATPCU.

8. The method of claim 1, wherein in the step of modeling and simulating the failures using a modeling tool, a stateflow modeling tool is used.

9. The method of claim 1, wherein the step of modeling and simulating the failures using a modeling tool further comprises steps of:
   modeling a transmission process of an input failure and a self-failure in a failure component using a stateflow component model, outputting the output failure to simulink through stateflow, and obtaining a transmission result of the failures in a display device of the simulink;
   establishing an overall architecture of the failure logic model and a failure transmission relationship of the modules in a Matlab/simulink component;
   changing the self-failure and the input failure of a bottom layer module in a simulink component, and indicating whether the failure happens via a Boolean value generated in a switch form;
   establishing an event-driven model in a stateflow component, wherein the driving conditions are the input failure and the self-failure in the external simulink component; and
   transferring a bottom failure layer into the ATPCU, and setting the display device at the output end of the ATPCU to obtain a final simulation result.

* * * * *